United States Patent
Kim et al.

(10) Patent No.: US 9,812,626 B2
(45) Date of Patent: Nov. 7, 2017

(54) LIGHT EMITTING DEVICE

(71) Applicant: LG INNOTEK CO., LTD., Seoul (KR)

(72) Inventors: Sung Kyoon Kim, Seoul (KR); Young Bong Yoo, Seoul (KR); Sung Ho Choo, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/187,053

(22) Filed: Jun. 20, 2016

(65) Prior Publication Data

US 2016/0293819 A1 Oct. 6, 2016

Related U.S. Application Data

(63) Continuation of application No. 14/140,682, filed on Dec. 26, 2013, now Pat. No. 9,397,259.

(30) Foreign Application Priority Data

Dec. 27, 2012 (KR) .................. 10-2012-0154194

(51) Int. Cl.
*H01L 33/00* (2010.01)
*H01L 33/62* (2010.01)
(Continued)

(52) U.S. Cl.
CPC .......... *H01L 33/62* (2013.01); *H01L 25/0753* (2013.01); *H01L 27/156* (2013.01);
(Continued)

(58) Field of Classification Search
CPC ... H01L 33/62; H01L 27/156; H01L 25/0753; H01L 33/08; H01L 33/38; H01L 33/06; H01L 33/30
(Continued)

(56) References Cited

U.S. PATENT DOCUMENTS 9,397,259 B2 * 7/2016 Kim .................. H01L 25/0753
2008/0179602 A1 7/2008 Negley et al.
(Continued)

FOREIGN PATENT DOCUMENTS

CN 101652861 2/2010
WO WO 2012/011749 A2 1/2012

OTHER PUBLICATIONS

U.S. Office Action dated Jun. 3, 2015 issued in co-pending U.S. Appl. No. 14/140,682.
(Continued)

*Primary Examiner* — Thien F Tran
(74) *Attorney, Agent, or Firm* — Ked & Associates, LLP

(57) ABSTRACT

A light emitting device includes a substrate, a plurality of light emitting cells disposed on the substrate to be spaced apart from each other, and a connection wire electrically connecting adjacent ones of the light emitting cells. One of the adjacent light emitting cells includes a plurality of first segments, and the other of the adjacent light emitting cells includes a plurality of second segments respectively facing the first segments. A separation distance is provided between first and second segments facing each other, where each of which has an end contacting the connection wire is greater than a separation distance between first and second segments facing each other, and each of which has an end that does not contact the connection wire.

20 Claims, 7 Drawing Sheets

(51) Int. Cl.
   *H01L 25/075* (2006.01)
   *H01L 27/15* (2006.01)
   *H01L 33/08* (2010.01)
   *H01L 33/06* (2010.01)
   *H01L 33/30* (2010.01)
   *H01L 33/38* (2010.01)
(52) U.S. Cl.
   CPC .............. *H01L 33/06* (2013.01); *H01L 33/08* (2013.01); *H01L 33/30* (2013.01); *H01L 33/38* (2013.01); *H01L 2924/0002* (2013.01)
(58) Field of Classification Search
   USPC ..................................................... 257/88, 13
   See application file for complete search history.

(56) References Cited

U.S. PATENT DOCUMENTS

| | | |
|---|---|---|
| 2008/0230789 A1 | 9/2008 | Onushkin et al. |
| 2009/0322241 A1 | 12/2009 | Onushkin et al. |
| 2011/0089442 A1 | 4/2011 | Jing et al. |
| 2012/0097993 A1 | 4/2012 | Chen |
| 2012/0187424 A1 | 7/2012 | Kim et al. |

OTHER PUBLICATIONS

European Search Report dated Dec. 7, 2015 issued in Application No. 13199438.6.
U.S. Final Office Action dated Jan. 7, 2016 issued in co-pending U.S. Appl. No. 14/140,682.
Chinese Office Action dated Jul. 28, 2017 issued in Application No. 201310741261.4 (English translation attached).

* cited by examiner

LIGHT EMITTING DEVICE

CROSS REFERENCE TO RELATED APPLICATION

The present application is a Continuation of co-pending U.S. patent application Ser. No. 14/140,682 filed on Dec. 26, 2013, which claims priority under 35 U.S.C. §119 to Korean Patent Application No. 10-2012-0154194, filed in Korea on Dec. 27, 2012, whose entire disclosures are hereby incorporated by reference.

BACKGROUND

1. Field

Embodiments relate to a light emitting device.

2. Background

Based on the development of metal organic chemical vapor deposition, molecular beam epitaxy, and the like of gallium nitride (GaN), red, green and blue light emitting diodes (LEDs) that have high luminance and realize white light have been developed.

Such LEDs do not contain environmentally harmful materials such as mercury (Hg), which is used in existing luminaires, such as incandescent lamps and fluorescent lamps and thus exhibit excellent eco-friendliness, long lifespan, and low power consumption and thus are replacing conventional light sources. A core competitive factor in such LEDs is to achieve high luminance using chips with high efficiency and high power output and packaging techniques.

To realize high luminance, it is important to increase light extraction efficiency. To increase light extraction efficiency, research into various methods using flip-chip structures, surface texturing, patterned sapphire substrates (PSSs), a photonic crystal technology, anti-reflection layer structures, and the like is underway.

FIG. 1 is a plan view of an existing light emitting device 10.

The light emitting device 10 illustrated in FIG. 1 includes first and second electrode pads 22 and 24, nine light emitting regions 40, and connection metals 30 electrically connecting adjacent ones of the nine light emitting regions 40. In this regard, distances between the adjacent ones of the nine light emitting regions 40 are identical. Research into various methods of increasing luminous efficacy of the light emitting device 10 having such a general structure is underway.

In particular, a sidewall of a light emitting structure (not shown) of each of the light emitting regions 40 may be inclined with respect to a substrate (not shown) in order to prevent disconnection of connection metals 30. In this regard, loss of the light emitting regions 40 cannot be avoided and thus there is a need to increase the area of the light emitting regions 40.

The above references are incorporated by reference herein where appropriate for appropriate teachings of additional or alternative details, features and/or technical background.

BRIEF DESCRIPTION OF THE DRAWINGS

The embodiments will be described in detail with reference to the following drawings in which like reference numerals refer to like elements wherein.

DETAILED DESCRIPTION

Hereinafter, embodiments will be described in detail with reference to the annexed drawings. However, the disclosure may be embodied in many different forms and should not be construed as being limited to embodiments set forth herein. Rather, these embodiments are provided so that this disclosure will be thorough and complete, and will fully convey the scope of the disclosure to those skilled in the art.

It will be understood that when an element is referred to as being "on" or "under" another element, it can be directly on/under the element, and one or more intervening elements may also be present.

When an element is referred to as being "on" or "under", "under the element" as well as "on the element" can be included based on the element.

Figure 2:
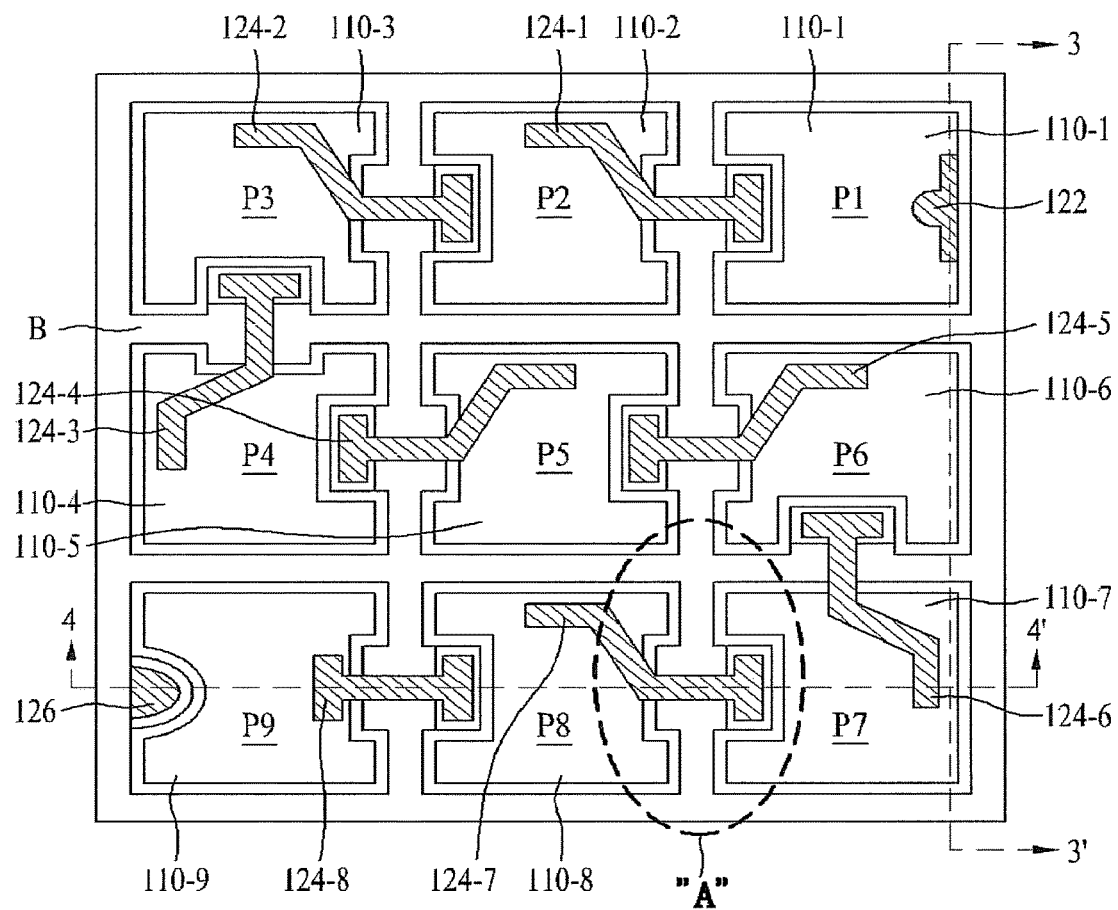
FIG. 2 is a plan view of a light emitting device according to an embodiment.
Figure 3:
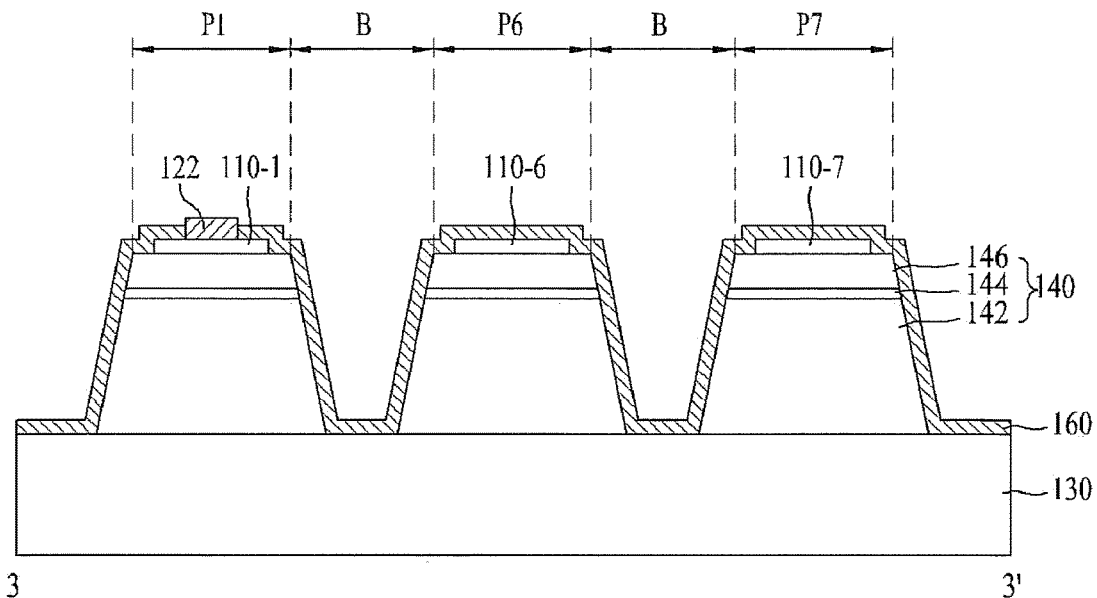
FIG. 3 is a sectional view taken along line 3-3' of FIG. 2.
Figure 4:
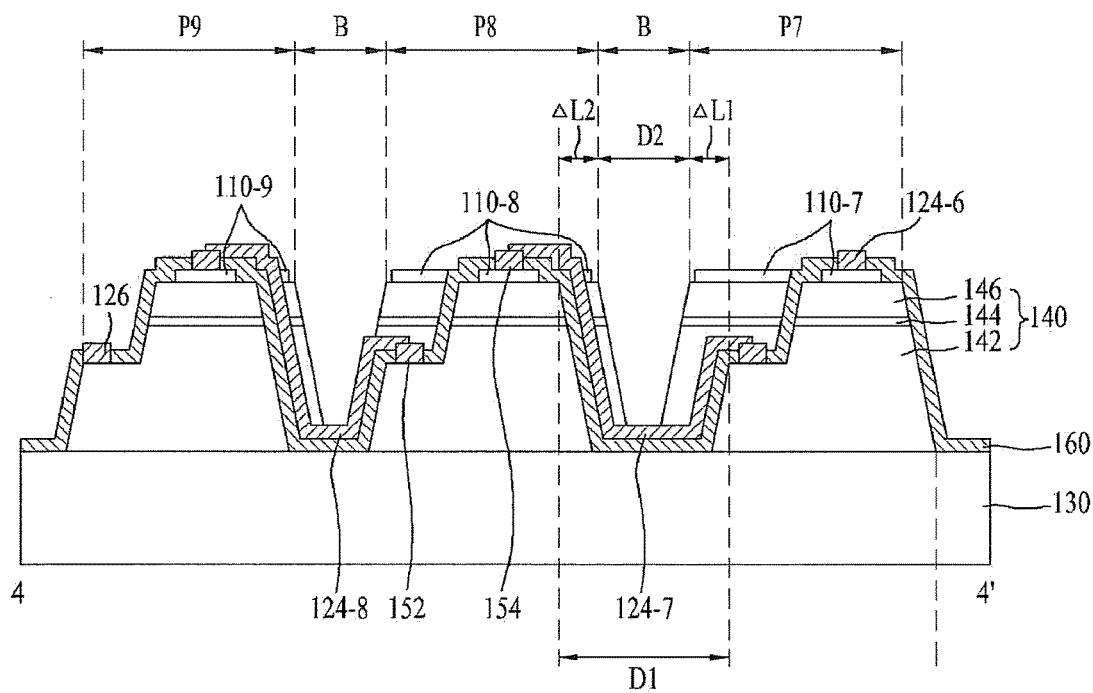
FIG. 4 is a sectional view taken along line 4-4' of FIG. 2.

FIG. 2 is a plan view of a light emitting device 100 according to an embodiment. FIG. 3 is a sectional view taken along line 3-3' of FIG. 2. FIG. 4 is a sectional view taken along line 4-4' of FIG. 2.

Referring to FIGS. 2 to 4, the light emitting device 100 includes first to $M^{th}$ conductive layers 110-1 to 110-M (wherein, M is a positive integer of 2 or greater), a first bonding pad 122, first to $N^{th}$ connection wires 124-1 to 124-N (wherein, N is a positive integer of 1 or greater), a second bonding pad 126, a substrate 130, and light emitting structures 140.

The substrate 130 may be formed of a material suitable for growth of semiconductor materials, e.g., a carrier wafer. In addition, the substrate 130 may be formed of a material with excellent thermal conductivity and may be a conductive substrate or an insulating substrate. In addition, the substrate 130 may be formed of an optically transmissive material and may have sufficient mechanical strength not to cause bending of the total nitride light emitting structures 140 of the light emitting device and to satisfactorily separate into chips through scribing and breaking. For example, the substrate 130 may be made of at least one material selected from among sapphire ($Al_2O_3$), GaN, SiC, ZnO, Si, GaP, InP, $Ga_2O_3$, GaAs, and Ge. The substrate 130 may be provided at an upper surface thereof with an uneven patterned portion. For example, although not shown, the substrate 130 may be a patterned sapphire substrate (PSS).

In addition, although not shown, a buffer layer may be disposed between the substrate 130 and the light emitting structures 140. The buffer layer may be formed using a Group III-V compound semiconductor. The buffer layer reduces a difference in lattice constant between the substrate 130 and the light emitting structures 140. For example, the buffer layer may include AlN or an undoped nitride, but embodiments are not limited thereto. The buffer layer may be omitted according to type of the substrate 130 and types of the light emitting structures 140.

Hereinafter, a case in which the number of light emitting cells is 9 will be described by way of example for convenience of explanation, but embodiments are not limited thereto. That is, the number of light emitting cells may be greater than 9 or less than 9.

The light emitting cells are arranged on the substrate 130 to be spaced apart from each other in a horizontal direction.

First, a plurality of light emitting regions P1 to PM is referred to, in ascending order, as first to $M^{th}$ light emitting regions. That is, a light emitting region in which the first bonding pad 122 is disposed is referred to as a first light emitting region P1, and a light emitting region in which the second bonding pad 126 is disposed is referred to as a ninth light emitting region.

First to $M^{th}$ light emitting cells are respectively arranged in the first to $M^{th}$ light emitting regions of the substrate 130. That is, the first light emitting cell is arranged in the first light emitting region P1 of the substrate 130, the second light emitting cell is arranged in the second light emitting region P2 of the substrate 130, the third light emitting cell is arranged in the third light emitting region P3 of the substrate 130, the fourth light emitting cell is arranged in the fourth light emitting region P4 of the substrate 130, the fifth light emitting cell is arranged in the fifth light emitting region P5 of the substrate 130, the sixth light emitting cell is arranged in the sixth light emitting region P6 of the substrate 130, the seventh light emitting cell is arranged in the seventh light emitting region P7 of the substrate 130, the eighth light emitting cell is arranged in the eighth light emitting region P8 of the substrate 130, and the ninth light emitting cell is arranged in the ninth light emitting region P9 of the substrate 130. As such, an $m^{th}$ light emitting cell is arranged in an $m^{th}$ light emitting region Pm where $1 \leq m \leq M$. Hereinafter, the $m^{th}$ light emitting cell is represented as 'Pm' for convenience of explanation.

Each of the first to $M^{th}$ light emitting cells P1 to PM includes the light emitting structure 140, an $m^{th}$ conductive layer 110-$m$, and first and second electrodes 152 and that are disposed on the substrate 130. The light emitting structure 140 constituting one light emitting cell may be separated from the light emitting structure 140 of another light emitting cell by a boundary region B. The boundary region B may be a region located in a boundary of each of the first to $M^{th}$ light emitting cells P1 to PM, e.g., the substrate 130. The first to $M^{th}$ light emitting cells P1 to PM may have the same area, but embodiments are not limited thereto. For example, according to another embodiment, the first to $M^{th}$ light emitting cells P1 to PM may have different areas according to frequency of light emission of light emitting cells.

The light emitting structure 140 of each of the first to $M^{th}$ light emitting cells P1 to PM includes a first conductive type semiconductor layer 142, an active layer 144, and a second conductive type semiconductor layer 146 that are sequentially disposed on the substrate 130.

The first conductive type semiconductor layer 142 may be disposed between the substrate 130 and the active layer 144 and include a semiconductor compound, be formed of a Group III-V or II-VI compound semiconductor, and be doped with a first conductive type dopant. For example, the first conductive type semiconductor layer 142 may include at least one of a semiconductor material having the formula of $Al_xIn_yGa_{(1-x-y)}N$, wherein $0 \leq x \leq 1$, $0 \leq y \leq 1$, and $0 \leq x+y \leq 1$, InAlGaN, AlGaAs, GaP, GaAs, GaAsP, and AlGaInP. When the first conductive type semiconductor layer 142 is of an n-type, the first conductive type dopant may include an n-type dopant such as Si, Ge, Sn, Se, Te, or the like. The first conductive type semiconductor layer 142 may have a single layer structure or a multilayer structure, but embodiments are not limited thereto.

The active layer 144 is disposed between the first conductive type semiconductor layer 142 and the second conductive type semiconductor layer 146, may include any one of a single well structure, a multi-well structure, a single quantum well structure, a multi quantum well (MQW) structure, a quantum dot structure, or a quantum wire structure, and formed of a Group III-V or II-VI compound semiconductor. The active layer 144 may have at least one pair structure of a well layer/a barrier layer, e.g., of InGaN/GaN, InGaN/InGaN, GaN/AlGaN, InAlGaN/GaN, GaAs (InGaAs)/AlGaAs, and GaP(InGaP)/AlGaP, but embodiments are not limited thereto. The well layer may be formed of a material having a lower energy band gap than that of the barrier layer.

The second conductive type semiconductor layer 146 is disposed on the active layer 144 and may include a semiconductor compound. The second conductive type semiconductor layer 146 may be formed of a Group III-V semiconductor compound, a Group II-VI semiconductor compound, or the like. For example, the second conductive type semiconductor layer 146 may include at least one of a semiconductor material having the formula of $In_xAl_yGa_{1-x-y}N$ where $0 \leq x \leq 1$, $0 \leq y \leq 1$, and $0 \leq x+y \leq 1$, AlInN, AlGaAs, GaP, GaAs, GaAsP, or AlGaInP.

The second conductive type semiconductor layer 146 may be of a second conductive type. When the second conductive type semiconductor layer 146 is of a p-type, the second conductive type dopant may be a p-type dopant such as Mg, Zn, Ca, Sr, Ba, or the like. The second conductive type semiconductor layer 146 may have a single layer or multilayer structure, but embodiments are not limited thereto.

The first conductive type semiconductor layer 142 may be of an n-type and the second conductive type semiconductor layer 146 may be of a p-type. In another embodiment, the first conductive type semiconductor layer 142 may be of a p-type and the second conductive type semiconductor layer 146 may be of an n-type. Accordingly, the light emitting structure 140 may include at least one of an n-p junction structure, a p-n junction structure, an n-p-n junction structure, or a p-n-p junction structure.

Hereinafter, a case in which the first conductive type semiconductor layer 142 is of an n-type and the second conductive type semiconductor layer 146 is of a p-type will be described by way of example, but embodiments are not limited thereto. That is, the present embodiment may also be applied to a case in which the first conductive type semiconductor layer 142 is of a p-type and the second conductive type semiconductor layer 146 is of an n-type.

In each of the first to $M^{th}$ light emitting cells P1 to PM, the first electrode 152 is disposed on the first conductive type semiconductor layer 142. For example, referring to FIG. 4, the first electrode 152 of the eighth light emitting cell P8 is disposed on the first conductive type semiconductor layer 142. To dispose the first electrode 152 on the first conductive type semiconductor layer 142, the first conductive type semiconductor layer 142 of the light emitting structure 140 may be partially exposed. That is, the second conductive type semiconductor layer 146, the active layer 144, and the first conductive type semiconductor layer 142 may be partially etched by mesa etching to expose a portion of the first conductive type semiconductor layer 142. In this regard, an exposed surface of the first conductive type semiconductor layer 142 may be disposed lower than a lower surface of the active layer 144.

In another embodiment, instead of separately arranging the first electrode 152 of each of the first to $M^{th}$ light emitting cells P1 to PM on the first conductive type semiconductor layer 142, the first electrode 152 of an i$^{th}$ light emitting cell Pi where 1 n i ight emitting cell Pi where 1 n the fii$^{th}$ connection wire 124-i. In this regard, the first electrode of the M$^{th}$ light emitting cell (e.g., the ninth light emitting cell P9) may be integrally formed with the second bonding pad 126, but embodiments are not limited thereto. For example, the first electrode of the M$^{th}$ light emitting cell PM may be separately formed from the second bonding pad 126.

In each of the first to M$^{th}$ light emitting cells P1 to PM, the second electrode 154 is disposed on the second conductive type semiconductor layer 146. For example, referring to FIG. 4, the second electrode 154 of the eighth light emitting cell P8 is disposed on the second conductive type semiconductor layer 146.

In another embodiment, instead of separately arranging the second electrode 154 of each of the first to M$^{th}$ light emitting cells P1 to PM on the second conductive type semiconductor layer 146, the second electrode of a j$^{th}$ light emitting cell Pj where 2 2 ting cell Pj where 2 ayer 146, the second electrode of a f the first to Mr 14ctive type semiconductor layer 146. For example, referseventh light emitting cell P7 may be integrally formed with the sixth connection wire 124-6. In this regard, referring to FIG. 3, the second electrode of the first light emitting cell P1 may be integrally formed with the first bonding pad 122, but embodiments are not limited thereto. That is, the second electrode of the first light emitting cell P1 may be separately formed from the first bonding pad 122.

For illustrative purposes only, FIG. 4 illustrates that the first electrode 152 of the eighth light emitting cell P8 and the eighth connection wire 124-8 are separately formed and the second electrode 154 of the eighth light emitting cell P8 and the seventh connection wire 124-7 are separately formed, while the second electrode of the seventh light emitting cell P7 is integrally formed with the sixth connection wire 124-6. For convenience of manufacturing processes, however, the first and second electrodes of the first to M$^{th}$ light emitting cells P1 to PM may be integrally or separately formed with or from the corresponding connection wires.

Each of the first and second electrodes of each of the first to M$^{th}$ light emitting cells P1 to PM may have a structure in which an adhesive layer (not shown), a barrier layer (not shown), and a bonding layer (not shown) are sequentially stacked. The adhesive layer of the first electrode may include a material in ohmic contact with the first conductive type semiconductor layer 142, and the adhesive layer of the second electrode may include a material in ohmic contact with the second conductive type semiconductor layer 146. For example, the adhesive layer may be formed as a single layer or multiple layers using at least one of Cr, Rd, or Ti.

The barrier layer is disposed on the adhesive layer and may be formed as a single layer or multiple layers using at least one of Ni, Cr, Ti, or Pt. For example, the barrier layer may be formed of a Cr—Pt alloy.

In addition, a reflection layer formed of Ag or the like may be disposed between the barrier layer and the adhesive layer, but may be omitted. The bonding layer is disposed on the barrier layer and may include Au.

The first bonding pad 122 may be bonded with a wire (not shown) for supplying a first power. Referring to FIGS. 2 and 3, the first bonding pad 122 may be disposed on the second conductive type semiconductor layer 146 of any one (e.g., the first light emitting cell P1) of the first to M$^{th}$ light emitting cells P1 to PM and contact the second conductive type semiconductor layer 146.

In addition, the second bonding pad 126 may be bonded with a wire (not shown) for supplying a second power. Referring to FIGS. 2 and 4, the second bonding pad 126 may be disposed on the first conductive type semiconductor layer 142 of another (e.g., the ninth light emitting cell P9) of the first to M$^{th}$ light emitting cells P1 to PM and contact the first conductive type semiconductor layer 142.

In addition, each of the conductive layers 110-1 to 110-M may be disposed between the second electrode and the second conductive type semiconductor layer 146. Each of the conductive layers 110-1 to 110-M reduces total reflection and are highly optically transmissive and thus may increase extraction efficiency of light having been emitted from the active layer 144 and passed through the second conductive type semiconductor layer 146. Each conductive layer 110-m may be formed as a single layer or multiple layers using at least one of oxide-based materials that have high transmittance with respect to luminescence wavelengths and are transparent, e.g., indium tin oxide (ITO), tin oxide (TO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), aluminum tin oxide (ATO), gallium zinc oxide (GZO), IrO$_x$, RuO$_x$, RuO$_x$/ITO, Ni, Ag, Ni/IrO$_x$/Au, or Ni/IrO$_x$/Au/ITO.

An area of each conductive layer 110-m disposed on the second conductive type semiconductor layer 146 may be equal to or less than an area of an upper surface of the second conductive type semiconductor layer 146.

Meanwhile, the first to N$^{th}$ connection wires 124-1 to 124-N serve to electrically connect the first to M$^{th}$ light emitting cells P1 to PM. That is, each of the first to N$^{th}$ connection wires 124-1 to 124-N electrically connects adjacent ones of the first to M$^{th}$ light emitting cells P1 to PM. That is, the i$^{th}$ connection wire 124-i where 1≤i connection wire 124-i whi$^{th}$ light emitting region Pi, an i+1$^{th}$ light emitting region P(i+1), and a boundary region B therebetween to electrically connect the i$^{th}$ light emitting region Pi and the i+1$^{th}$ light emitting region P(i+1) that adjoin each other. For example, the first connection wire 124-1 (wherein i=1) electrically connects the first light emitting cell P1 and the second light emitting cell P2 that are adjacent to each other and, as illustrated in FIG. 4, the seventh connection wire 124-7 is disposed on the seventh light emitting region P7, the eighth light emitting region P8, and a boundary region B therebetween to electrically connect the first conductive type semiconductor layer 142 of the seventh light emitting cell P7 and the second conductive type semiconductor layer 146 of the eighth light emitting cell P8.

As illustrated in FIGS. 2 to 4, the first to M$^{th}$ light emitting cells P1 to PM are electrically connected to each other in series by the first to N$^{th}$ connection wires 124-1 to 124-N. In this case, N=M−1. The first to N$^{th}$ connection wires 124-1 to 124-N may connect the first to M$^{th}$ light emitting cells P1 to PM in series, starting from the first light emitting cell P1 in which the first bonding pad 122 is disposed and ending with the M$^{th}$ light emitting cell PM in which the second bonding pad 126 is disposed, but embodiments are not limited thereto. That is, at least a portion of the first to M$^{th}$ light emitting cells P1 to PM may be electrically connected to each other in parallel by a connection wire.

Each of the first to N$^{th}$ connection wires 124-1 to 124-N may be formed of the same or different materials as that of each of the first and second electrodes 152 and 154. When the first to N$^{th}$ connection wires 124-1 to 124-N are formed of the same material as that of the first and second electrodes 152 and 154, as described above, the connection wire may be integrally formed with the first or second electrode. Each of the first to $N^{th}$ connection wires 124-1 to 124-N may include at least one of Cr, Rd, Au, Ni, Ti, or Pt, but embodiments are not limited thereto.

Meanwhile, an insulating layer 160 is disposed between each of the first to $N^{th}$ connection wires 124-1 to 124-N and adjacent light emitting cells connected by the corresponding connection wire to electrically separate the connection wire from the adjacent light emitting cells. That is, the insulating layer 160 is disposed between the $i^{th}$ connection wire 124-*i* and adjacent $i^{th}$ and $i+1^{th}$ light emitting cells Pi and P(i+1) connected by the $i^{th}$ connection wire 124-*i* to electrically separate the $i^{th}$ connection wire 124-*i* from the $i^{th}$ light emitting cell Pi and electrically separate the $i^{th}$ connection wire 124-*i* from the $i+1^{th}$ light emitting cell P(i+1). For example, referring to FIG. 4, the insulating layer 160 is disposed between the seventh connection wire 124-7 and adjacent seventh and eighth light emitting cells P7 and P8 to electrically separate the seventh connection wire 124-7 from each of the seventh and eighth light emitting cells P7 and P8.

In addition, the insulating layer 160 may be disposed on the first to $M^{th}$ light emitting cells P1 to PM and the boundary regions B. That is, the insulating layer 160 may cover upper and side surfaces of the first to $M^{th}$ light emitting cells P1 to PM and the boundary regions B. In this regard, the insulating layer 160 exposes the first and second bonding pads 122 and 126 and the first and second electrodes of each of the first to $M^{th}$ light emitting cells P1 to PM.

For example, referring to FIG. 3, the insulating layer 160 covers upper and side surfaces of each light emitting structure 140 of the first, sixth and seventh light emitting cells P1, P6 and P7 and the boundary regions B while exposing the first bonding pad 122. In addition, referring to FIG. 4, the insulating layer 160 covers upper and side surfaces of each light emitting structure 140 and the boundary regions B while exposing the second bonding pad 126 and the first and second electrodes of each of the seventh, eighth and ninth light emitting cells P7, P8 and P9. The insulating layer 160 may be formed of an optically transmissive and insulating material, e.g., $SiO_2$, $SiO_x$, $SiO_xN_y$, $Si_3N_4$, or $Al_2O_3$ and embodied as a distributed Bragg reflector or the like, but embodiments are not limited thereto.

Figure 5:
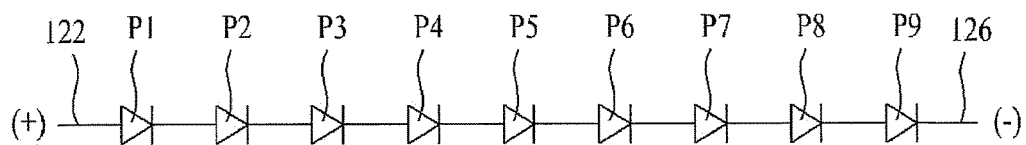
FIG. 5 is a circuit diagram of the light emitting device of FIG. 2.

FIG. 5 is a circuit diagram of the light emitting device 100 of FIG. 2.

Referring to FIGS. 2 and 5, the light emitting device 100 may have a common single positive (+) terminal, e.g., the first bonding pad 122, and a common single negative (−) terminal, e.g., the second bonding pad 126.

Figure 6:
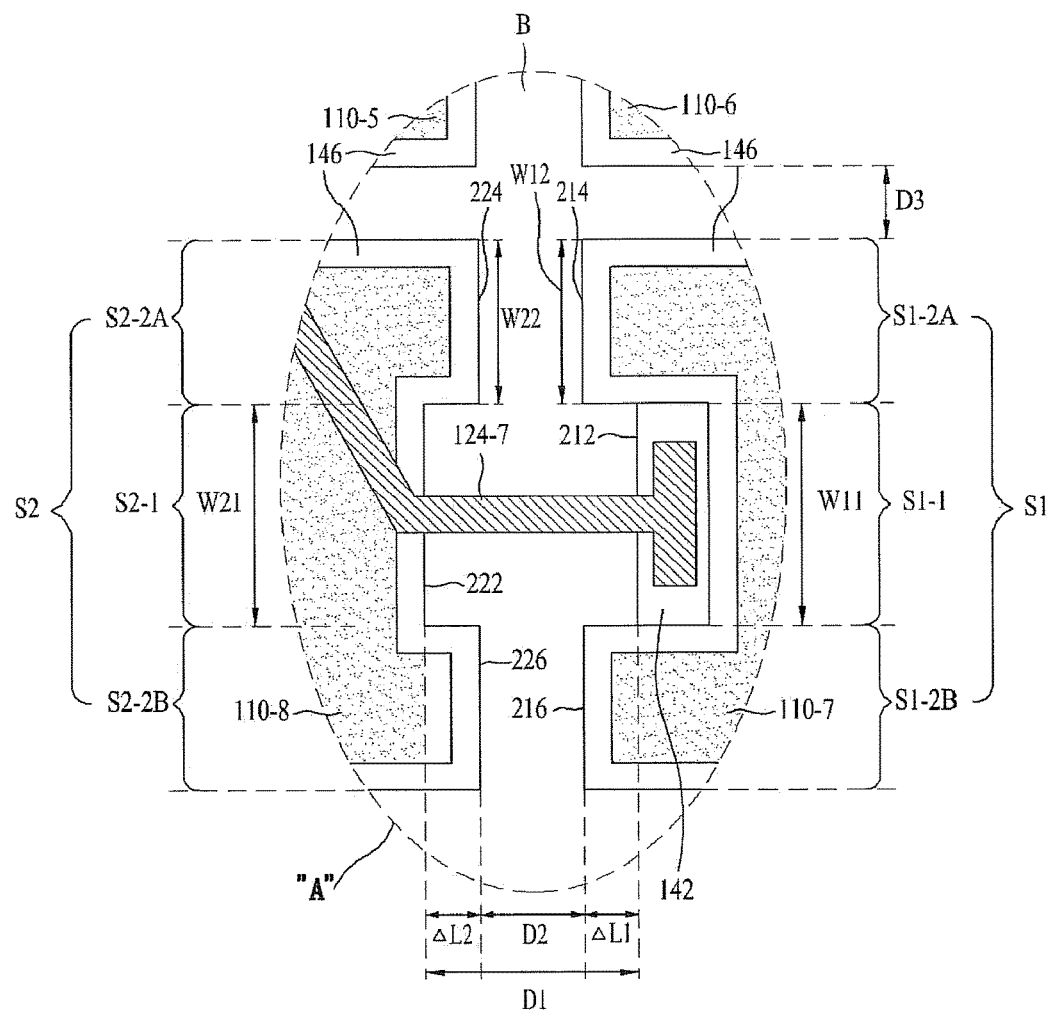
FIG. 6 is an enlarged plan view of portion "A" of FIG. 2.

FIG. 6 is an enlarged plan view of portion "A" illustrated in FIG. 2.

Referring to FIGS. 2 and 6, among adjacent $i^{th}$ and $i+1^{th}$ light emitting cells Pi and P(i+1) where 1 P(i ere, the $i^{th}$ light emitting cell Pi includes a plurality of first segments S1, and the $i+1^{th}$ light emitting cell P(i+1) includes a plurality of second segments S2 respectively facing the first segments S1.

First, the first segments S1 of the $i^{th}$ light emitting cell Pi include a 1-1 segment S1-1 and 1-2 segments S1-2A and S1-2B. The 1-1 segment S1-1 has an end contacting the $i^{th}$ connection wire 124-*i*, and each of the 1-2 segments S1-2A and S1-2B extends from the 1-1 segment S1-1 and has an end that does not contact the $i^{th}$ connection wire 124-*i*. In this regard, the 1-2 segments S1-2A and S1-2B may be arranged so as to respectively extend from opposite sides of the 1-1 segment S1-1.

For example, referring to FIG. 6, the 1-1 segment S1-1 has an end 212 contacting the seventh connection wire 124-7. The 1-2 segment S1-2A extends from a first side of the 1-1 segment S1-1 and has an end 214 that does not contact the seventh connection wire 124-7, and the 1-2 segment S1-2B extends from a second side of the 1-1 segment S1-1 and has an end 216 that does not contact the seventh connection wire 124-7.

In addition, the second segments S2 of the $i+1^{th}$ light emitting cell P(i+1) include a 2-1 segment S2-1 and 2-2 segments S2-2A and S2-2B. The 2-1 segment S2-1 has an end contacting the $i^{th}$ connection wire 124-*i* and faces the 1-1 segment S1-1. The 2-2 segments S2-2A and S2-2B extend from the 2-1 segment S2-1, have respective ends that do not contact the $i^{th}$ connection wire 124-*i*, and respectively face the 1-2 segments S1-2A and S1-2B. In this regard, the 2-2 segments S2-2A and S2-2B may be arranged so as to respectively extend from opposite sides of the 2-1 segment S2-1.

For example, referring to FIG. 6, the 2-1 segment S2-1 has an end 222 contacting the seventh connection wire 124-7 and faces the 1-1 segment S1-1. The 2-2 segment S2-2A extends from a first side of the 2-1 segment S2-1, has an end 224 that does not contact the seventh connection wire 124-7, and faces the 1-2 segment S1-2A. The 2-2 segment S2-2B extends from a second side of the 2-1 segment S2-1, has an end 226 that does not contact the seventh connection wire 124-7, and faces the 1-2 segment S1-2B.

In addition, a separation distance between the first and second segments S1 and S2 respectively having ends that do not contact the $i^{th}$ connection wire 124-*i* and face each other is smaller than a separation distance between the first and second segments S1 and S2 respectively having ends contacting the $i^{th}$ connection wire 124-*i* and facing each other.

That is, assuming that a separation distance between a segment (e.g., the 1-1 segment S1-1) having an end contacting the $i^{th}$ connection wire 124-*i* among the first segments S1-1, S1-2A and S1-2B of the $i^{th}$ light emitting cell Pi and a segment (e.g., the 2-1 segment S2-1) having an end contacting the $i^{th}$ connection wire 124-*i* among the second segments S2-1, S2-2A and S2-2B of the $i+1^{th}$ light emitting cell P(i+1) is denoted as 'D1' and a separation distance between a segment (e.g., the 1-2 segment S1-2A or S1-2B) having an end that does not contact the $i^{th}$ connection wire 124-*i* among the first segments S1-1, S1-2A and S1-2B and a segment (e.g., the 2-2 segment S2-2A or S2-2B) having an end that does not contact the $i^{th}$ connection wire 124-*i* among the second segments S2 is denoted as 'D2,' D2 is smaller than D1.

For example, referring to FIGS. 4 and 6, the separation distance D2 between the end 214 of the 1-2 segment S1-2A and the end 224 of the 2-2 segment S2-2A is smaller than the separation distance D1 between the end 212 of the 1-1 segment S1-1 and the end 222 of the 2-1 segment S2-1. In addition, the separation distance D2 between the end 216 of the 1-2 segment S1-2B and the end 226 of the 2-2 segment S2-2B is smaller than the separation distance D1 between the end 212 of the 1-1 segment S1-1 and the end 222 of the 2-1 segment S2-1.

As such, to decrease the separation distance D2 more than the separation distance D1, the 2-2 segments S2-2A and S2-2B may not protrude and only the 1-2 segments S1-2A and S1-2B may protrude towards the $i+1^{th}$ light emitting cell P(i+1). In another embodiment, the 1-2 segments S1-2A and S1-2B may not protrude and only the 2-2 segments S2-2A and S2-2B may protrude towards the $i^{th}$ light emitting cell Pi, or both the 1-2 segments S1-2A and S1-2B and the 2-2 segments S2-2A and S2-2B may protrude.

Referring to FIGS. 4 and 6, the end 214 of the 1-2 segment S1-2A facing the 2-2 segment S2-2A may protrude more than the end 212 of the 1-1 segment S1-1 facing the 2-1 segment S2-1 by a first protrusion length ΔL11. Similarly, the end 216 of the 1-2 segment S1-2B facing the 2-2 segment S2-2B may protrude more than the end 212 by a first protrusion length ΔL12. In this regard, ΔL11 and ΔL12 may be the same or different. Hereinafter, a case in which ΔL11 and ΔL12 are identical will be described by way of example for convenience of explanation and, as illustrated in FIG. 6, ΔL11 and ΔL12 are denoted as ΔL1.

In addition, the end 224 of the 2-2 segment S2-2A facing the 1-2 segment S1-2A may protrude more than the end 222 of the 2-1 segment S2-1 facing the 1-1 segment S1-1 by a second protrusion length ΔL21. Similarly, the end 226 of the 2-2 segment S2-2B facing the 1-2 segment S1-2B may protrude more than the end 222 of the 2-1 segment S2-1 facing the 1-1 segment S1-1 by a second protrusion length ΔL22. In this regard, ΔL21 and ΔL22 may be the same or different. Hereinafter, a case in which ΔL21 and ΔL22 are identical will be described by way of example for convenience of explanation and, as illustrated in FIG. 6, ΔL21 and ΔL22 are denoted as ΔL2.

The first protrusion length ΔL1 and the second protrusion length ΔL2 may be identical or different.

In addition, a width W11 of the end 212 of the 1-1 segment S1-1 of the $i^{th}$ light emitting cell Pi and a width W21 of the end 222 of the 2-1 segment S2-1 of the i+1$^{th}$ light emitting cell P(i+1) may be identical or different.

In addition, a width W12 of the ends 214 and 216 of the respective 1-2 segments S1-2A and S1-2B of the $i^{th}$ light emitting cell Pi and a width W22 of the ends 225 and 226 of the respective 2-2 segments S2-2A and S2-2B of the i+1$^{th}$ light emitting cell P(i+1) may be identical or different.

In addition, an end of the first conductive type semiconductor layer 142 in the 1-1 segment S1-1 may contact the $i^{th}$ connection wire 124-i, and an end of the second conductive type semiconductor layer 146 in the 2-1 segment S2-1 may contact the $i^{th}$ connection wire 124-i. For example, referring to FIG. 6, an end of the first conductive type semiconductor layer 142 in the 1-1 segment S1-1 may contact the seventh connection wire 124-7, and an end of the second conductive type semiconductor layer 146 in the 2-1 segment S2-1 may contact the seventh connection wire 124-7.

The separation distances D1 and D2 between light emitting cells adjacent to each other in a horizontal direction have already been described above. In addition, the foregoing description may also be applied to light emitting cells adjacent to each other in a vertical direction. For example, referring to FIG. 6, a separation distance D3 between the light emitting cells adjacent to each other in a vertical direction (e.g., sixth and seventh light emitting cells P6 and P7 or fifth and eighth light emitting cells P5 and P8) may be the same as the separation distance D2.

Figure 1:
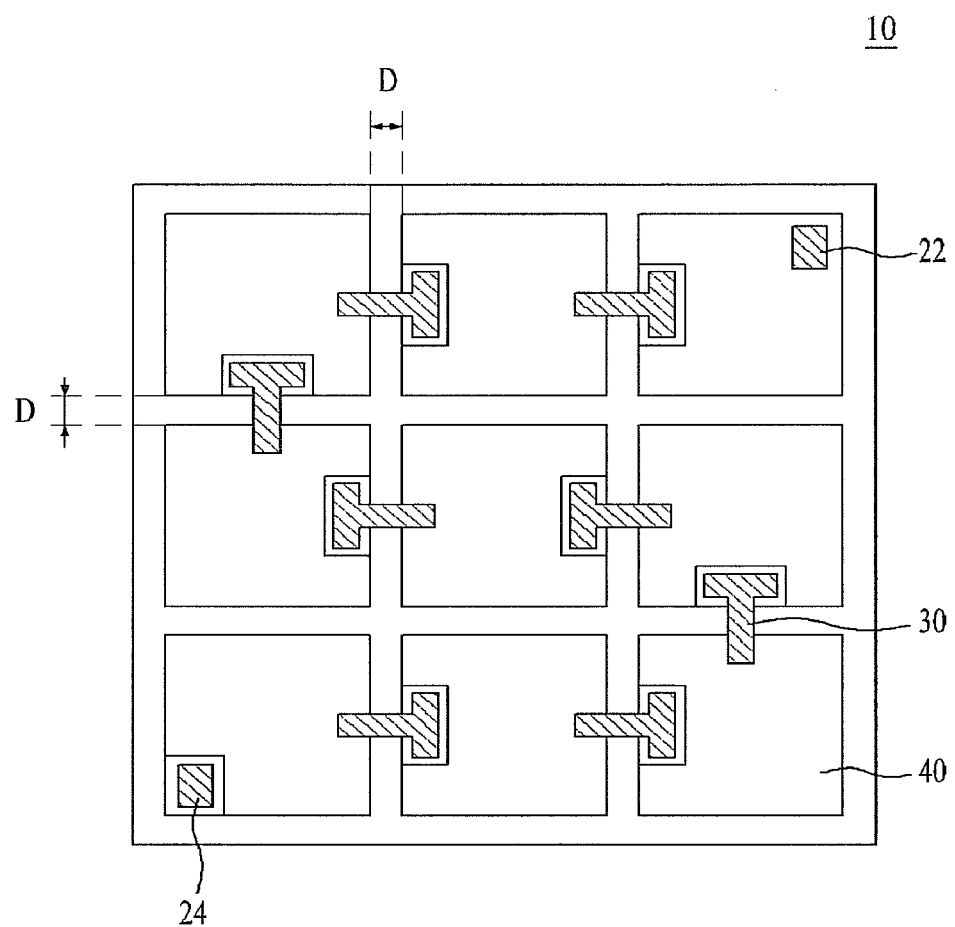
FIG. 1 is a plan view of an existing light emitting device.

In the existing light emitting device 10 of FIG. 1, separation distances D between adjacent ones of the light emitting regions 40 may be identical. By contrast, according to embodiments, D2 is smaller than D1. As such, so as not to cause electrical short circuit in a portion in which the $i^{th}$ connection wire 124-i electrically connects the $i^{th}$ light emitting cell Pi and the i+1$^{th}$ light emitting cell P(i+1), at least one of D1, W11 or W21 has to remain constant. For example, when D1 is less than 10 μm or greater than 55 μm, electrical short circuit may be caused at a portion in which the $i^{th}$ light emitting cell Pi and the i+1$^{th}$ light emitting cell P(i+1) are electrically connected by the $i^{th}$ connection wire 124-i. Thus, D1 may be between 10 and 55 μm.

In addition, when each of W11 and W21 is less than 5 μm or greater than 8 μm, electrical short circuit may be caused at a portion in which the $i^{th}$ light emitting cell Pi and the i+1$^{th}$ light emitting cell P(i+1) are electrically connected by the $i^{th}$ connection wire 124-i. Thus, each of W11 and W21 may be between 5 and 8 μm.

As such, when D1, W11, and W21 are kept at constant values so as to prevent electrical short circuit, the separation distance D2 between the ends 214 and 224 (or 216 and 226) of the respective first and second segments S1 and S2, not contacting the $i^{th}$ connection wire 124-i, may be minimized. When D2 is less than 5 μm, it may be difficult to manufacture the light emitting device 100 and, on the other hand, when D2 exceeds 50 μm, an increase in each light emitting region may be insignificant. Thus, when D1, W11 and W21 are within the above-described ranges, D2 may for example be between 5 and 50 μm, but embodiments are not limited thereto.

Thus, when compared to the existing light emitting device 10 of FIG. 1, according to embodiments, a total light emitting area TPA may be increased as shown in Equation 1 below, assuming that the 1-2 segments S1-2A and S1-2B have the same first protrusion length ΔL1 and the same width W12, the 2-2 segments S2-2A and S2-2B have the same second protrusion length ΔL2 and the same width W22, the first to $M^{th}$ light emitting cells P1 to PM have the same area and a tetragonal shape, and D of FIG. 1 corresponds to D1 of FIG. 6.

$$TPA = [(W12 \times \Delta L1) \times 2 + (W22 \times \Delta L2) \times 2] \times (M-1) \quad \text{[Equation 1]}$$

As seen from Equation 1 above, the light emitting device 100 according to the embodiment has a larger light emitting area than that of the existing light emitting device 10 by TPA. Thus, light extraction efficiency may be enhanced.

Hereinafter, improvements in luminous intensity Po and operating voltage Vf according to increase in unit area of each light emitting cell, assuming that the first to $M^{th}$ light emitting cells P1 to PM (wherein, M=21) of the light emitting device 100 of FIGS. 2 to 4 have the same area, will be described as follows.

Figure 7:
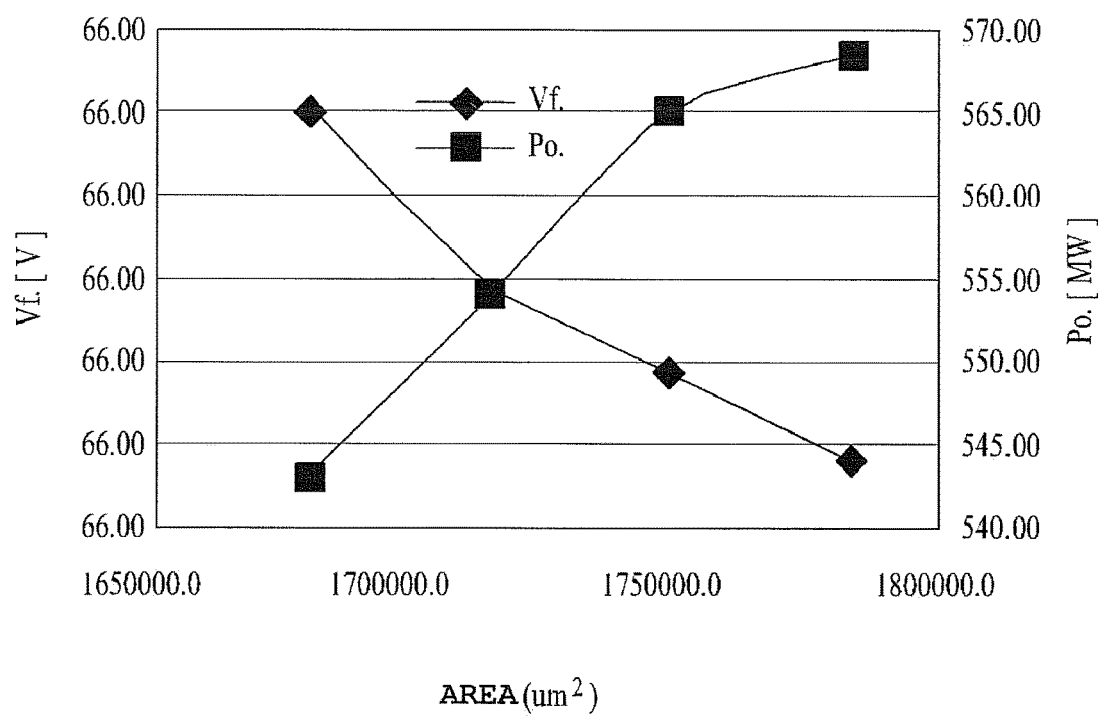
FIG. 7 is a graph showing luminous intensity and operating voltage according to increase in light emitting area.

FIG. 7 is a graph showing luminous intensity Po and operating voltage Vf according to increase in light emitting area. In FIG. 7, a horizontal axis denotes the light emitting area and a vertical axis denotes the luminous intensity Po and the operating voltage Vf.

Changes in the luminous intensity Po and the operating voltage Vf are observed by varying the width (x) and height (y) lengths of each of the first to $M^{th}$ light emitting cells P1 to PM, and results are shown in Table 1 below and FIG. 7.

TABLE 1

| X (μm) | Y (μm) | Unit area (μm$^2$) | Total area (μm$^2$) | Active increase (%) | Vf (Volt) | Po (mW) |
|---|---|---|---|---|---|---|
| 400.0 | 200.0 | 80,000 | 1,680,000 | 100.0 | 66.50 | 543.00 |
| 404.0 | 202.0 | 81,608 | 1,713,768 | 102.0 | 66.29 | 553.91 |
| 408.0 | 204.0 | 83,248 | 1,748,215 | 104.1 | 66.19 | 565.05 |
| 412.1 | 206.1 | 84,922 | 1,783,354 | 106.2 | 66.08 | 568.52 |

In this regard, the unit area denotes an area of a single light emitting cell, the total area denotes an area obtained by summing the areas of the 21 light emitting cells, and the active increase denotes an increase of the light emitting region and is represented by percentage.

From Equation 1, Table 1 and FIG. 7, it can be confirmed that, although changes in area of a light emitting region of each light emitting cell according to W11, W22, ΔL1, and ΔL2 insignificantly increase, luminous intensity Po and operating voltage Vf may be enhanced as the number (e.g., M=21) of light emitting cells increases. In addition, current density may be reduced, which results in enhanced reliability.

Although FIGS. 2 to 6 illustrate each of the first to $M^{th}$ light emitting cells P1 to PM of the light emitting device 100 as having a horizontal structure, embodiments are not limited thereto. That is, the present embodiment may also be applied to a case in which each of the first to $M^{th}$ light emitting cells P1 to PM has a vertical structure or a flip chip structure.

A plurality of light emitting devices according to the embodiment may be arranged on a substrate as a light emitting device package, and an optical member such as a light guide plate, a prism sheet, a diffusion sheet, or the like may be disposed on an optical path of the light emitting device package. The light emitting device package, the substrate, and the optical member may function as a backlight unit.

According to another embodiment, there is provided a display device, an indicating device, or a lighting system including the light emitting device according to the embodiment. For example, the lighting system may include lamps, street lamps, and the like.

Figure 8:
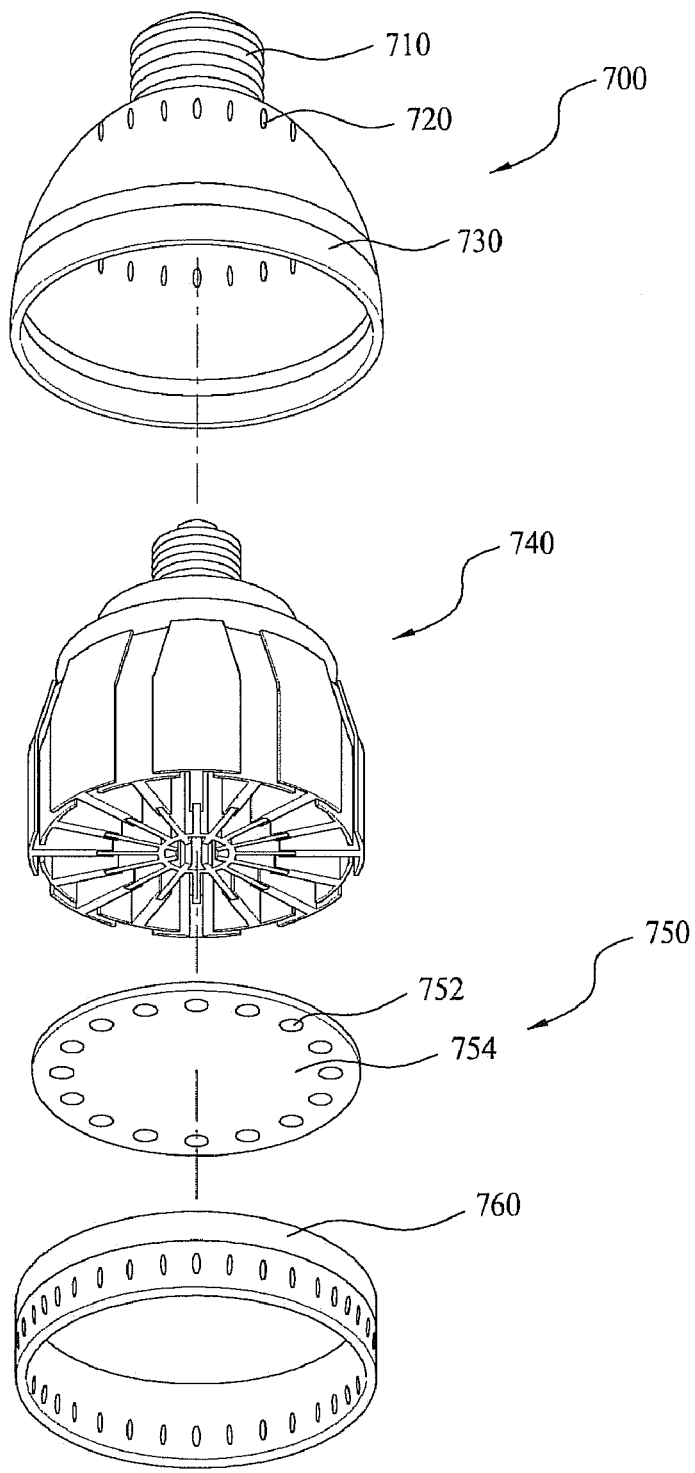
FIG. 8 is an exploded perspective view of a lighting device including the light emitting device according to the embodiment.

FIG. 8 is an exploded perspective view of a lighting device including the light emitting device according to the embodiment. Referring to FIG. 8, the lighting device includes a light source 750 to emit light, a housing 700 for accommodating the light source 750, a heat dissipation unit 740 for dissipating heat generated from the light source 750, and a holder 760 for coupling the light source 750 and the heat dissipation unit 740 to the housing 700.

The housing 700 includes a socket coupling unit 710 coupled to an electrical socket (not shown) and a body unit 730 connected to the socket coupling unit 710 and accommodating the light source 750. The body unit 730 may be provided with a single airflow hole 720 perforated therethrough.

In another embodiment, a plurality of airflow holes 720 may be formed in the body unit 730 of the housing 700. That is, the number of the airflow holes 720 may be at least one. The airflow holes 720 may be arranged in the body unit 730 in a radial form or various other forms.

The light source 750 includes a plurality of light emitting device packages 752 disposed on a substrate 754. The substrate 754 may have a shape allowing insertion into an opening of the housing 700 and be made of a material having a high thermal conductivity to transfer heat to the heat dissipation unit 740 as described below. The light emitting device packages may include the above-described light emitting device.

The light source 750 may be provided at a lower portion thereof with the holder 760, and the holder 760 may include a frame and other airflow holes. In addition, although not shown, the light source 750 may be provided at a lower portion thereof with an optical member to diffuse, scatter or converge light emitted from the light emitting device packages 752 of the light source 750.

Figure 9:
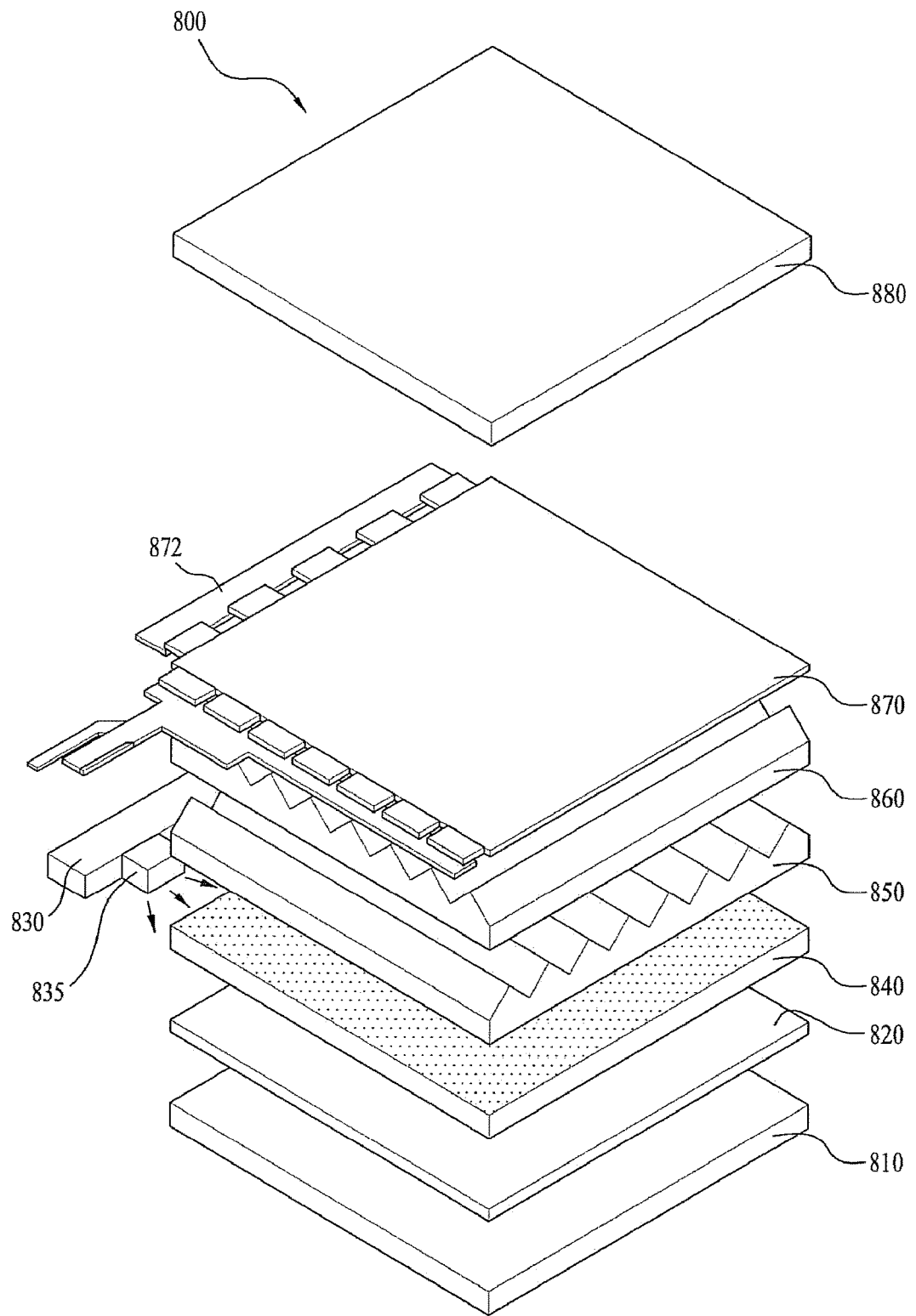
FIG. 9 is a view of a display device including the light emitting device according to the embodiment.

FIG. 9 is a view of a display device 800 including the light emitting device according to the embodiment.

Referring to FIG. 9, the display device 800 may include a bottom cover 810, a reflective plate 820 disposed on the bottom cover 810, a light emitting module (including a substrate 830 and light emitting device packages 835) to emit light, a light guide plate 840 disposed at a front side of the reflective plate 820 and guiding light emitted from the light emitting module towards a front side of the display device 800, an optical sheet including prism sheets 850 and 860 disposed at a front side of the light guide plate 840, a display panel 870 disposed at a front side of the optical sheet, an image signal output circuit 872 connected to the display panel 870 and supplying an image signal to the display panel 870, and a color filter 880 disposed at a front side of the display panel 870. In this regard, the bottom cover 810, the reflective plate 820, the light emitting module 830 and 835, the light guide plate 840, and the optical sheet may constitute a backlight unit.

The light emitting module includes the light emitting device packages 835 on the substrate 830. In this regard, the substrate 830 may be a PCB or the like. The light emitting device packages 835 may include the light emitting device according to the embodiment.

The bottom cover 810 may accommodate elements of the display device 800. The reflective plate 820 may be arranged as a separate element as illustrated in FIG. 9 or may be arranged by coating a material having a high reflectance on a rear surface of the light guide plate 840 or a front surface of the bottom cover 810.

In this regard, the reflective plate 820 may be made of a material having a high reflectance and enabling ultra-thin film fabrication, e.g., polyethylene terephthalate (PET).

The light guide plate 840 may be made of polymethylmethacrylate (PMMA), polycarbonate (PC), polyethylene (PE), or the like.

The first prism sheet 850 may include a support film and a layer of polymer with light transmission and elasticity, and the layer of polymer may include a prism layer in which a plurality of three-dimensional structures is repeated. In this regard, the structure patterns may be formed such that ridges and valleys are repeated in a stripe form as illustrated in FIG. 9.

In the second prism sheet 860, a direction in which ridges and valleys at a surface of a support film extend may be perpendicular to a direction in which the ridges and the valleys at the surface of the support film of the first prism sheet 850 extend. Such a configuration serves to uniformly disperse light transmitted from the light emitting module and the reflective plate 820 towards the entire surface of the display panel 870.

Although not shown, a diffusion sheet may be disposed between the light guide plate 840 and the first prism sheet 850. The diffusion sheet may be formed of a polyester or polycarbonate-based material and maximally increase a light projection angle through refraction and scattering of light incident from the backlight unit. In addition, the diffusion sheet may include a support layer including a light diffusing agent and first and second layers formed on a light emitting surface (in the direction of the first prism sheet 850) and a light incident surface (in the direction of the reflective plate 820) and excluding a light diffusing agent.

In the present embodiment, the diffusion sheet, the first prism sheet 850, and the second prism sheet 860 constitute an optical sheet. In another embodiment, the optical sheet may include other combinations, e.g., a micro lens array, a combination of a diffusion sheet and a micro lens array, a combination of a single prism sheet and a micro lens array, or the like.

The display panel 870 may include a liquid crystal display panel. In addition, the display panel 870 may include other types of display devices requiring a light source other than the liquid crystal display panel.

As is apparent from the above description, the light emitting device according the embodiment has wider light emitting regions than an existing light emitting device and thus luminous intensity and operating voltage may be enhanced, and current density may be reduced and thus reliability may be enhanced.

Embodiments provide a light emitting device with enhanced luminous efficacy by increasing the area of light emitting regions.

In one embodiment, a light emitting device includes a substrate, a plurality of light emitting cells disposed on the substrate to be spaced apart from each other, and a connection wire electrically connecting adjacent ones of the light emitting cells, wherein one of the adjacent light emitting cells includes a plurality of first segments, and the other of the adjacent light emitting cells includes a plurality of second segments respectively facing the first segments, wherein a first separation distance between first and second segments facing each other, each of which has an end contacting the connection wire is greater than a second separation distance between first and second segments facing each other, each of which has an end that does not contact the connection wire.

The first segments may include a 1-1 segment having an end contacting the connection wire and a 1-2 segment extending from the 1-1 segment and having an end that does not contact the connection wire, and the second segments may include a 2-1 segment having an end contacting the connection wire and facing the 1-1 segment and a 2-2 segment extending from the 2-1 segment, having an end that does not contact the connection wire, and facing the 1-2 segment.

The end of the 1-2 segment facing the 2-2 segment may protrude more than the end of the 1-1 segment facing the 2-1 segment by a first protrusion length.

The end of the 2-2 segment facing the 1-2 segment may protrude more than the end of the 2-1 segment facing the 1-1 segment by a second protrusion length.

The first protrusion length and the second protrusion length may be identical or different from each other.

The 1-2 segment may be disposed to extend from opposite sides of the 1-1 segment, and the 2-2 segment may be disposed to extend from opposite sides of the 2-1 segment.

The end of the 1-1 segment and the end of the 2-1 segment may have the same or different widths.

The end of the 1-2 segment and the end of the 2-2 segment have the same or different widths.

Each of the adjacent light emitting cells may include a first conductive type semiconductor layer disposed on the substrate, an active layer disposed on the first conductive type semiconductor layer, and a second conductive type semiconductor layer disposed on the active layer.

An end of the first conductive type semiconductor layer in the 1-1 segment may contact the connection wire, and an end of the second conductive type semiconductor layer in the 2-1 segment may contact the connection wire.

A separation distance between the end of the 1-2 segment and the end of the 2-2 segment may be between 5 μm and 50 μm.

A separation distance between the respective ends of the 1-1 segment and the 2-1 segment may be between 10 μm and 55 μm.

The end of the 1-1 segment may have a width of 5 μm to 8 μm.

The end of the 2-1 segment may have a width of 5 μm to 8 μm.

The light emitting cell including the first segments and the light emitting cell including the second segments may be adjacent each other in at least one of vertical or horizontal directions.

The light emitting device may have an increased light emitting region as shown in the following equation:

$$TPA=[(W12\times\Delta L1)\times 2+(W22\times\Delta L2)\times 2]\times(M-1)$$

wherein TPA denotes an increased area of the light emitting region, $W12$ denotes a width of the end of the 1-2 segment, $\Delta L1$ denotes a first protrusion length by which the end of the 1-2 segment facing the 2-2 segment protrudes more than the end of the 1-1 segment facing the 2-1 segment, $W22$ denotes a width of the end of the 2-2 segment, $\Delta L2$ denotes a second protrusion length by which the end of the 2-2 segment facing the 1-2 segment protrudes more than the end of the 2-1 segment facing the 1-1 segment, and M denotes the number of the light emitting cells.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
   a substrate;
   a plurality of light emitting cells arranged on the substrate to be spaced apart from each other; and
   a connection wire configured to electrically connect the plurality of lighting cells which are disposed adjacent to each other,
   wherein one of the plurality of light emitting cells comprises a plurality of first segments, and another one of the plurality of light emitting cells comprises a plurality of second segments respectively facing the first segments,
   wherein the first segments comprise:
   a 1-1 segment having an end plane contacting the connection wire; and
   at least two 1-2 segments extending from both sides of the 1-1 segment, each of the at least two 1-2 segments having an end plane that does not contact the connection wire, and
   the second segments comprise:
   a 2-1 segment having an end plane contacting the connection wire and facing the 1-1 segment; and at least two 2-2 segments extending from both sides of the 2-1 segment, each of the at least two 2-2 segments having an end plane that does not contact the connection wire, and facing the 1-2 segment, wherein a first separation distance between the 1-1 segment and the 2-1 segment facing each other is greater than a second separation distance between the 1-2 segment and the 2-2 segment, wherein each of the end planes of the 1-2 segments facing the 2-2 segments protrudes more than the end plane of the 1-1 segment facing the 2-1 segment by a first protrusion length, wherein each of the end planes of the 2-2 segments facing the 1-2 segments protrudes more than the end plane of the 2-1 segment facing the 1-1 segment by a second protrusion length, and wherein the first protrusion length and the second protrusion length are identical.

2. The light emitting device according to claim 1, wherein the 1-2 segment is disposed to extend from opposite sides of the 1-1 segment, and the 2-2 segment is disposed to extend from opposite sides of the 2-1 segment.

3. The light emitting device according to claim 1, wherein the end plane of the 1-1 segment and the end plane of the 2-1 segment have different widths.

4. The light emitting device according to claim 1, wherein the end plane of the 1-2 segment and the end plane of the 2-2 segment have different widths.

5. The light emitting device according to claim 1, wherein each of the adjacent light emitting cells comprises:
a first conductive type semiconductor layer disposed on the substrate;
an active layer disposed on the first conductive type semiconductor layer; and
a second conductive type semiconductor layer disposed on the active layer.

6. The light emitting device according to claim 5, wherein an end of the first conductive type semiconductor layer in the 1-1 segment contacts the connection wire, and an end of the second conductive type semiconductor layer in the 2-1 segment contacts the connection wire.

7. The light emitting device according to claim 1, wherein the first separation distance between the respective end planes of the 1-1 segment and the 2-1 segment is between 10 μm and 55 μm.

8. The light emitting device according to claim 1, wherein the second separation distance between the respective end planes of the 1-2 segment and the 2-2 segment is between 5 μm and 50 μm.

9. The light emitting device according to claim 1, wherein the end plane of the 1-1 segment has a width of 5 μm to 8 μm.

10. The light emitting device according to claim 1, wherein the end plane of the 2-1 segment has a width of 5 μm to 8 μm.

11. The light emitting device according to claim 1, wherein a light emitting cell comprising the first segments and a light emitting cell comprising the second segments are adjacent each other in at least one of vertical or horizontal direction.

12. The light emitting device according to claim 1, wherein the light emitting device has an increased light emitting region as shown in the following equation:

$$TPA=[(W12 \times \Delta L1) \times 2+(W22 \times \Delta L2) \times 2] \times (M-1)$$

wherein TPA denotes an increased area of the light emitting region, W12 denotes a width of the end plane of the 1-2 segment, ΔL1 denotes a first protrusion length by which the end plane of the 1-2 segment facing the 2-2 segment protrudes more than end plane of the 1-1 segment facing the 2-1 segment, W22 denotes a width of the end plane of the 2-2 segment, ΔL2 denotes a second protrusion length by which the end plane of the 2-2 segment facing the 1-2 segment protrudes more than the end plane of the 2-1 segment facing the 1-1 segment, and M denotes the number of the light emitting cells.

13. A light emitting device, comprising:
a substrate;
a plurality of light emitting cells arranged on the substrate to be spaced apart from each other; and
a connection wire configured to electrically connect the plurality of lighting cells which are disposed adjacent to each other,
wherein a first one of the plurality of light emitting cells comprises a plurality of first segments, and a second one of the plurality of light emitting cells comprises a plurality of second segments respectively facing the first segments,
wherein the first segments comprise:
a 1-1 segment having an end plane contacting the connection wire; and
at least two 1-2 segments extending from both sides of the 1-1 segment, each of the at least two 1-2 segments having an end plane that does not contact the connection wire, and
the second segments comprise:
a 2-1 segment having an end plane contacting the connection wire and facing the 1-1 segment; and
at least two 2-2 segments extending from both sides of the 2-1 segment, each of the at least two 2-2 segments having an end plane that does not contact the connection wire, and facing the 1-2 segment,
wherein a first separation distance between the 1-1 segment and the 2-1 segment facing each other is greater than a second separation distance between the 1-2 segment and the 2-2 segment,
wherein a third one of the plurality of light emitting cells is electrically not connected with a fourth one of the plurality of light emitting cells,
wherein the third and fourth light emitting cells are adjacent to each other, and
wherein the first separation distance is greater than a third separation distance between the third and fourth light emitting cells.

14. The light emitting device according to claim 13, wherein each of the end planes of the 1-2 segments facing the 2-2 segments protrudes more than the end plane of the 1-1 segment facing the 2-1 segment by a first protrusion length.

15. The light emitting device according to claim 13, wherein each of end planes of the 2-2 segments facing the 1-2 segments protrudes more than the end plane of the 2-1 segment facing the 1-1 segment by a second protrusion length.

16. The light emitting device according to claim 13, wherein the first separation distance between the respective end planes of the 1-1 segment and the 2-1 segment is between 10 μm and 55 μm.

17. A light emitting device, comprising:
a substrate;
a plurality of light emitting cells arranged on the substrate to be spaced apart from each other; and a connection wire configured to electrically connect the plurality of lighting cells which are disposed adjacent to each other, wherein a first one of the plurality of light emitting cells comprises a plurality of first segments, and a second one of the plurality of light emitting cells comprises a plurality of second segments respectively facing the first segments, wherein the first segments comprise:

a 1-1 segment having an end plane contacting the connection wire; and at least two 1-2 segments extending from both sides of the 1-1 segment, each of the at least two 1-2 segments having an end plane that does not contact the connection wire, and the second segments comprise:

a 2-1 segment having an end plane contacting the connection wire and facing the 1-1 segment; and at least two 2-2 segments extending from both sides of the 2-1 segment, each of the at least two 2-2 segments having an end plane that does not contact the connection wire, and facing the 1-2 segment, wherein a first separation distance between the 1-1 segment and the 2-1 segment facing each other is greater than a second separation distance between the 1-2 segment and the 2-2 segment, wherein a third one of the plurality of light emitting cells is electrically not connected with a fourth one of the plurality of light emitting cells, wherein the third and fourth light emitting cells are adjacent to each other, and wherein the second separation distance is the same as a third separation distance between the third and fourth light emitting cells.

18. The light emitting device according to claim 17, wherein each of the end planes of the 1-2 segments facing the 2-2 segments protrudes more than the end plane of the 1-1 segment facing the 2-1 segment by a first protrusion length.

19. The light emitting device according to claim 17, wherein each of end planes of the 2-2 segments facing the 1-2 segments protrudes more than the end plane of the 2-1 segment facing the 1-1 segment by a second protrusion length.

20. The light emitting device according to claim 17, wherein each of the second separation distance and the third separation distance is between 5 μm and 50 μm.

* * * * *